(12) United States Patent
Zhang

(10) Patent No.: US 9,983,258 B2
(45) Date of Patent: May 29, 2018

(54) ATE DIGITAL CHANNEL FOR RF FREQUENCY/POWER MEASUREMENT

(71) Applicant: ADVANTEST CORPORATION, Tokyo (JP)

(72) Inventor: Wei Min Zhang, Shanghai (CN)

(73) Assignee: ADVANTEST

( * ) Notice: Subject to any disclaimer, the term of this patent is extended or adjusted under 35 U.S.C. 154(b) by 245 days.

(21) Appl. No.: 14/438,214

(22) PCT Filed: Mar. 14, 2013

(86) PCT No.: PCT/CN2013/000286
§ 371 (c)(1),
(2) Date: Apr. 23, 2015

(87) PCT Pub. No.: WO2014/139048
PCT Pub. Date: Sep. 18, 2014

(65) Prior Publication Data
US 2015/0276855 A1    Oct. 1, 2015

(51) Int. Cl.
*G01R 31/302* (2006.01)
*G01R 31/28* (2006.01)
*G01R 31/319* (2006.01)

(52) U.S. Cl.
CPC ... *G01R 31/2822* (2013.01); *G01R 31/31905* (2013.01); *G01R 31/31903* (2013.01)

(58) Field of Classification Search
CPC .......... G01R 31/2822; G01R 31/31905; G01R 31/31903
See application file for complete search history.

(56) References Cited

U.S. PATENT DOCUMENTS

| 2008/0027158 A1 | 1/2008 | Imming et al. |
| 2009/0033339 A1 | 2/2009 | Clunn |
| 2011/0169545 A1 | 7/2011 | Minassian et al. |

FOREIGN PATENT DOCUMENTS

| CN | 1582398 A | 2/2005 |
| CN | 101464491 A | 6/2009 |
| EP | 1367402 A1 | 3/2003 |

OTHER PUBLICATIONS

Azais et al., Low-cost SNR estimation of analog signals using standard digital automated test equipment (ATE), 10th IEEE International NEWCAS Conference, Montreal, QC, Jun. 2012, pp. 197-200.*
Pous et al., On the Use of Standard Digital ATE for the Analysis of RF Signals, European Test Symposium, May 2010, Prague, Czech Republic. 15th IEEE European Test Symposium, pp. 43-48, 2010.*
Amplitude, available at https://en.wikipedia.org/wiki/Amplitude on Jan. 19, 2012.*

\* cited by examiner

*Primary Examiner* — Daniel Miller

(57) ABSTRACT

A method for testing using an automated test equipment (ATE) is disclosed. The method comprises capturing a radio frequency (RF) signal using a digital port on automated test equipment, wherein the RF signal is transmitted from a device under test (DUT) to be tested by the automated test equipment. It also comprises sampling the RF signal at a high sampling rate using a digital channel associated with the digital port. Further, it comprises generating a discrete signal using results from the sampling. Finally, it comprises determining a frequency and amplitude of the RF signal using the discrete signal.

20 Claims, 12 Drawing Sheets

ATE DIGITAL CHANNEL FOR RF FREQUENCY/POWER MEASUREMENT

CROSS REFERENCE

This application is a National Stage of PCT International Application No. PCT/CN2013/000286, filed on Mar. 14, 2013, the contents of which are hereby incorporated by reference.

FIELD OF THE INVENTION

Embodiments of the present invention relate generally to automated device testing ("ATE") and more specifically to testing related to radio frequency (RF) signals using ATE.

BACKGROUND OF THE INVENTION

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor. Automatic Test Equipment (ATE) is commonly used within the field of electrical chip manufacturing. ATE systems both reduce the amount of time spent on testing devices to ensure that the device functions as designed and serve as a diagnostic tool to determine the presence of faulty components within a given device before it reaches the consumer.

In testing devices or products, e.g. after production, it is crucial to achieve among others a high product quality, an estimation of the device or product performance, feedback concerning the manufacturing process and finally a high customer contentment. Usually a plurality of tests is performed in order to ensure the correct function of a device or product. Since testing a semiconductor device or a product, in general, may be quite expensive in terms of capital cost for required test equipment and cost in terms of required test time, testing of a device or product should be performed in an efficient way. Therefore, devices are often tested in parallel to reduce test time.

Testing of the radio frequency (RF) functionality of integrated circuit chips and the compliance of such functionality with an intended radio standard or specification, e.g., Bluetooth™, GSM™, etc., can be challenging from an efficiency standpoint because the number of RF ports on standard automated test equipment is limited. Typically, a pick and place machine will place the chip device to be tested in a suitably constructed test board of specialized ATE. The ATE applies the appropriate test signals to the device under test (DUT) and passes or rejects the device. Such individual chip testing exhibits a problem in that it is time consuming and, hence, adds to the overall manufacturing cost. Further, the limited number of RF ports on a typical ATE apparatus prevents testing multiple DUTs in parallel.

Accordingly, testing RF functionality of integrated circuit chips using conventional systems is costly. Trying to test for RF power and frequency using the limited number of RF ports makes multi-site testing and parallel execution of tests difficult. The cost per test (COT) may typically be unacceptable for customers especially where low cost integrated circuit chips are involved, since the cost of the test may be a significant component of the price per unit. In some cases, the COT may be up to 10% of the overall cost of manufacturing integrated wireless RF-containing system on a chip (SOC) devices.

BRIEF SUMMARY OF THE INVENTION

Accordingly, a method for testing and measuring the output of RF-enabled DUTs is needed that improves parallel test efficiency and throughput (units tested in an amount of time). Embodiments of the present invention provide methods and systems for testing radio frequency (RF) functionality of integrated circuit chips by using the standard ATE digital channels to measure RF frequency and power. Typically, a conventional ATE can have several hundred digital I/Os and channels while having fewer than ten parallel RF receiver ports. Therefore, using one of the readily available digital channels for testing RF power and frequency results in much higher efficiency and throughput than conventional systems using the limited number of RF ports.

In one embodiment of the present invention, a method for testing using an automated test equipment (ATE) is disclosed. The method comprises capturing a radio frequency (RF) signal using a digital port on automated test equipment, wherein the RF signal is transmitted from a device under test (DUT) to be tested by the automated test equipment. It also comprises sampling the RF signal at a high sampling rate using a digital channel associated with the digital port. Further, it comprises generating a discrete signal using results from the sampling. Finally, it comprises determining a frequency and amplitude of the RF signal using the discrete signal.

In another embodiment a tester system is disclosed. The system comprises a plurality of digital ports, wherein each of the plurality of digital ports is operable to capture a RF signal, wherein the RF signal is transmitted from a DUT. The system also comprises a plurality of digital channels, wherein each of the plurality of digital channels is associated with a respective digital port, and wherein each of the plurality of digital channels is configured to sample a respective RF signal. Further, the system comprises a control module communicatively coupled to the plurality of digital channels, wherein the control module is configured to: (a) generate a respective discrete signal using samples from the respective RF signal for each of the plurality of digital channels; and (b) determine a frequency and amplitude of the respective RF signal received through each of the plurality of digital channels using the respective discrete signal.

In one embodiment, an automated test equipment (ATE) apparatus is disclosed. The apparatus comprises a digital port operable to capture a radio frequency (RF) signal, wherein the RF signal is transmitted from a device under test (DUT). The apparatus also comprises a digital channel configured to sample the RF signal at a high sampling rate, wherein the digital channel is associated with the digital port. Further, it comprises a control module configured to: (a) generate a discrete signal using results from a sampled RF signal; and (b) determine a frequency and amplitude of the RF signal using the discrete signal.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
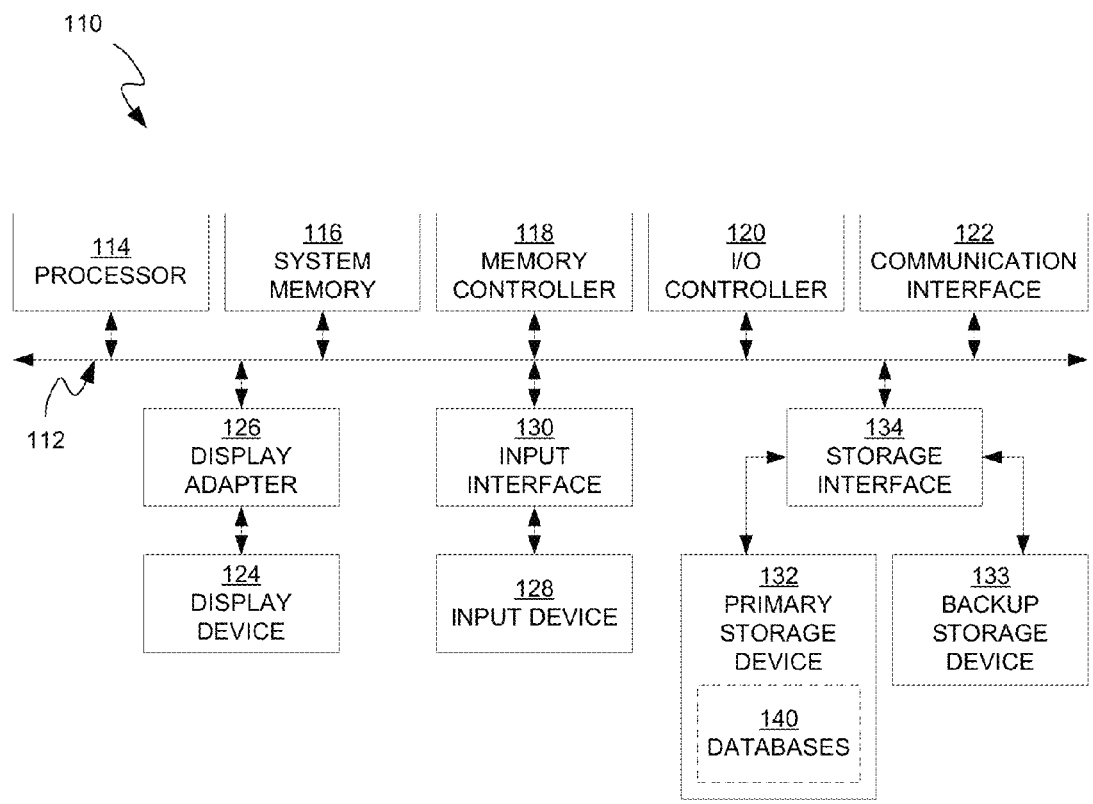
FIG. 1 is an exemplary computer system on which embodiments of the automated test system of the present invention can be implemented in accordance with one embodiment of the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "capturing," "sampling," "generating," "determining," "allocating," "associating," "executing," "accessing," "identifying" or the like, refer to actions and processes (e.g., flowchart 900 of FIG. 9) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram of an exemplary system controller of an automated test equipment (ATE) computing system 110 capable of implementing embodiments of the present disclosure. For example, computing system 110, in one embodiment, could implement the controller of the tester system. Computing system 110 broadly represents any single or multi-processor computing device or system capable of executing computer-readable instructions. Examples of computing system 110 include, without limitation, workstations, laptops, client-side terminals, servers, distributed computing systems, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running test plans may be stored on the computer-readable medium and then stored in system memory 116 and/or various portions of storage devices 132 and 133. When executed by the processor 114, the computer program may cause the processor 114 to perform and/or be a means for performing the functions required for sharing resources between multiple test cores in a concurrent test environment.

ATE Digital Channel for RF Frequency/Power Measurement

An objective for many manufacturers of radio frequency integrated circuits (RFICs) is cost-effective, high production throughput. With continual cuts in capital expenditures, companies are looking for easily supported solutions to increase capacity. With test costs approaching 5% to 10% of the unit cost, for example, minimizing test time can immediately affect the bottom line. For manufacturers to be competitive, the RFICs must be tested and calibrated in just a few seconds on average. One of the keys to fast and economical testing is to test several RFICs in parallel. This is problematic in conventional automated test equipment (ATE) because of the limited availability of RF ports on tester systems.

Embodiments of the present invention provide methods and systems for improving multi-site parallel testing of RFICs by using the standard ATE digital channels to measure RF frequency and power. Typically, a conventional ATE can have several hundred digital I/Os and channels while having fewer than ten RF receiver ports. Using the few RF ports for testing RF power and frequency for devices under test (DUTs) comprising RF functionality is, therefore, expensive and increases the cost of test (COT) for chip suppliers. Accordingly, using one of the readily available digital channels for testing RF power and frequency results in much higher efficiency and throughput than conventional systems using the limited number of RF ports.

The high COT of only using RF ports to test RF functionality of DUTs is unacceptable for the chip suppliers in many cases including, for example, manufacturers of Tire Pressure Monitoring Systems in cars. Cars monitor tire pressure by using an IC chip imbedded in the cars' tires that relays a RF signal to the main control panel if the pressure drops below a threshold level. The ICs used in Tire Pressure Monitoring Systems are too cheap to justify a high COT. Accordingly, using the freely available digital channels of the ATE as described herein for measuring RF power and frequency is advantageous in dramatically reducing the COT for these ICs. Using the digital channel enables low cost testing of the RF-enabled DUTs and allows for high multi-site parallel execution of the tests, which increases efficiency and throughput.

Figure 2:
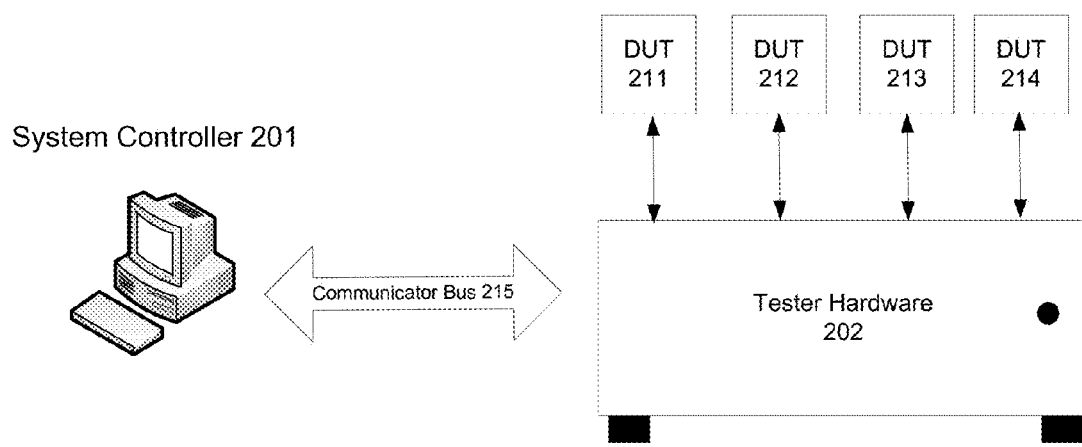
FIG. 2 is a schematic block diagram for an exemplary ATE tester apparatus on which embodiments of the present invention can be implemented.

FIG. 2 is a schematic block diagram for an exemplary ATE tester apparatus on which the RF power and frequency measuring embodiments of the present invention can be implemented. In one embodiment, the system controller 201 comprises one or more linked computers. For example, testing systems such as Advantest Corporation's T2000 or the V93000 SmartScale testing platforms, can use a network of computers. In other embodiments, the system controller often comprises only a single computer. In one embodiment, system controller can be a standard PC with a digital data acquisition card to interface it to the tester hardware. The control and test routines and analysis of data captured by the card are provided in software. The system controller 201 is the overall system control unit, and runs the software for the ATE that is responsible for accomplishing all the user-level testing tasks, including running the user's test plan.

The communicator bus 215 provides a high-speed electronic communication channel between the system controller and the tester hardware. The communicator bus can also be referred to as a backplane, a module connection enabler, or system bus. Physically, communicator bus 215 is a fast, high-bandwidth duplex connection bus that can be electrical, optical, etc. In one embodiment, communicator bus 215 can use the TCP/IP protocol. System controller 201 sets up the conditions for testing the DUTs 211-214 by programming the tester hardware through commands sent over the communicator bus 215.

Tester hardware 202 comprises the complex set of electronic and electrical parts and connectors necessary to provide the test stimulus to the devices under test (DUTs) 211-214 and measure the response of the DUTs to the stimulus, and compare it against the expected response. In one embodiment, tester hardware 202 can comprise multiple site controllers, wherein each site controller is connected to multiple DUTs. Each site controller is a computer used in a device test. A test plan program can be executed on a site controller. The site controllers are connected to the system controller and test operations performed by a user are processed on the system controller, which controls the site controllers over communicator bus 215.

Figure 3A:
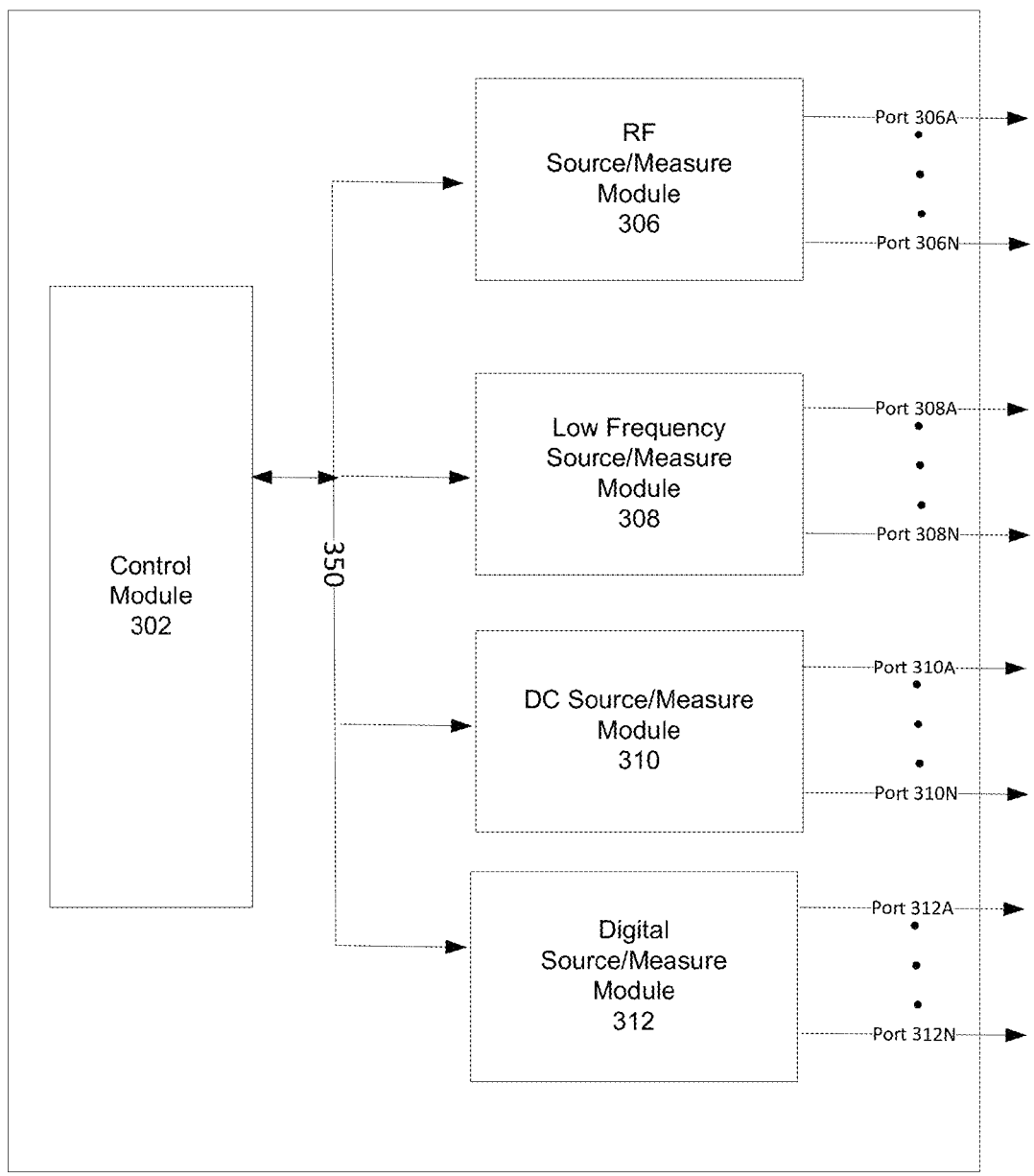
FIG. 3A is a high-level block diagram illustrating the components of the tester hardware system from FIG. 2 on which embodiments of the present invention can be implemented.

FIG. 3A is a high level block diagram illustrating the components of the tester hardware system 202 from FIG. 2 on which embodiments of the present invention can be implemented. Semiconductor devices which process analog as well as digital signals are tested with testers which can produce and receive analog and digital signals. These signals are called mixed signals. Tester hardware system 202 comprises a mixed signal tester because it can test DUTs that can process both analog and digital signals. It will be understood that FIG. 3 depicts only one possible embodiment of a mixed signal tester. Embodiments of the present invention can be implemented on any tester equipped with a digital channel that can be configured to capture RF signals.

Control module 302 is connected over one or more busses 350 to tester modules. Control module 302 receives its instructions from system controller 201. Tester hardware system 202 includes module 306 that processes RF signals. RF signals are loosely defined as those signals having frequencies in the range of approximately 10 MHz up to about 6 GHz. Tester hardware 202 also comprises a module 308 that processes lower frequency AC signals, sometimes called base band signals. It also comprises a module 310 that processes DC signals and another module 312 that processes digital signals.

The RF module is made up of a plurality of RF sources and receivers 306. Each RF source can be programmed to generate a test signal at a frequency and level specified by control module 302. Each RF receiver measures power of a received signal over a range of frequencies. The operating parameters of the source and receiver, such as power levels and frequency range, can be controlled by control module 302. The RF module 306 receives and transmits signal over a plurality of ports, 306A-306N.

The low frequency (base band) module is made up of low frequency analog sources and receivers 308 that transmit and receive signals over a plurality of ports, 308A-308N. These devices can be implemented using digital signal processing technology. A typical system might operate from 200 MHz to 1 GHz, allowing waveforms of almost any shape to be produced or analyzed.

The DC module comprises DC sources and meters 310. These devices can produce or measure DC bias conditions, which are relayed through ports 310A-310N.

The digital module generates and receives digital signals. It is made up of digital drivers and receivers 312, which transmit and receive digital signals over ports 312A-312N.

In one embodiment of the present invention, the receivers within the digital module 312 can be configured to measure the power and frequency of incoming RF signals. DUTs can be connected to tester hardware 202 through ports 306A-306N, 308A-308N, 310A-310N, and 312A-312N. Because the number of ports 306A-306N connected to RF module 306 are limited, one embodiment of the present invention accomplishes multi-site parallel execution of tests on multiple DUTs implementing RF protocols simultaneously by using digital ports 310A-310N instead.

To test the various connected DUTs, control module 302, in one embodiment, may execute a program. Alternatively, the program may be executed on system controller 201 and instructions may be passed down to control module 302 to execute test operations. The test program can configure tester hardware 202 to make measurements by specifying the settings for instruments 306, 308, 310 and 312. Measurements are made and passed back to control module 302. Tester hardware 202 can then be reconfigured to take the subsequent set of measurements. This process may be repeated until all the measurements are taken.

Figure 3B:
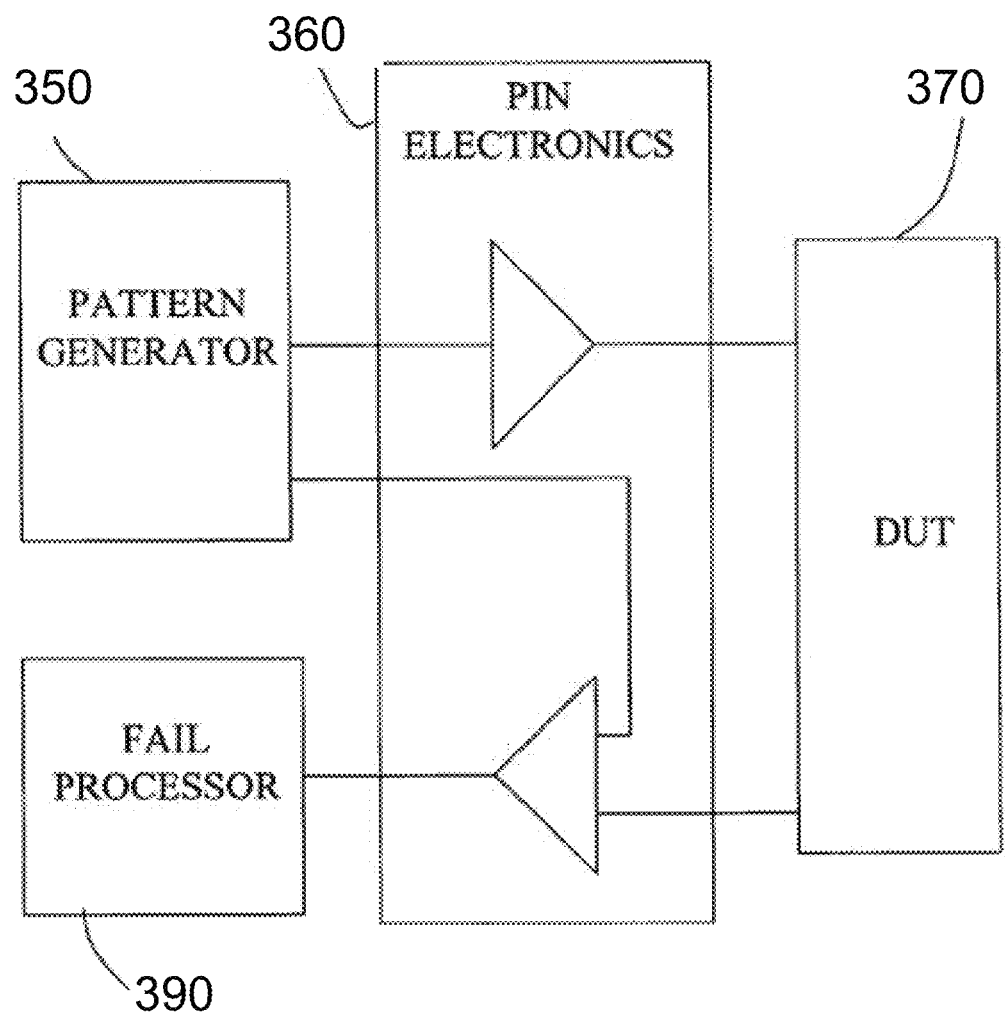
FIG. 3B is a high-level block diagram of the architecture for an exemplary ATE digital channel for driving data to a DUT and comparing the DUT response data to expected data on which embodiments of the present invention can be implemented.

FIG. 3B is a high-level block diagram of the architecture for an exemplary ATE digital channel for driving data to a DUT and comparing the DUT response data to expected data on which embodiments of the present invention can be implemented. FIG. 3B provides further details on the operation of digital module 312 from FIG. 3A. Tester data signals originating from a pattern generator 350 are fed by digital module 312 to a device-under-test (DUT) 370 via interface circuitry commonly referred to as pin electronics 360. Response signals from the DUT are captured using digital module 312 and compared to expected data with the resulting comparison data fed to a failure processor 390 in order to determine pass or fail conditions. The "expected" and "drive" data are typically programmed in the pattern generator vector memory to occur at precise timings, in accordance with how a DUT should behave. If the data captured from the DUT fails to correspond with an expected condition, the device is considered to have failed that aspect of the test.

Figure 4:
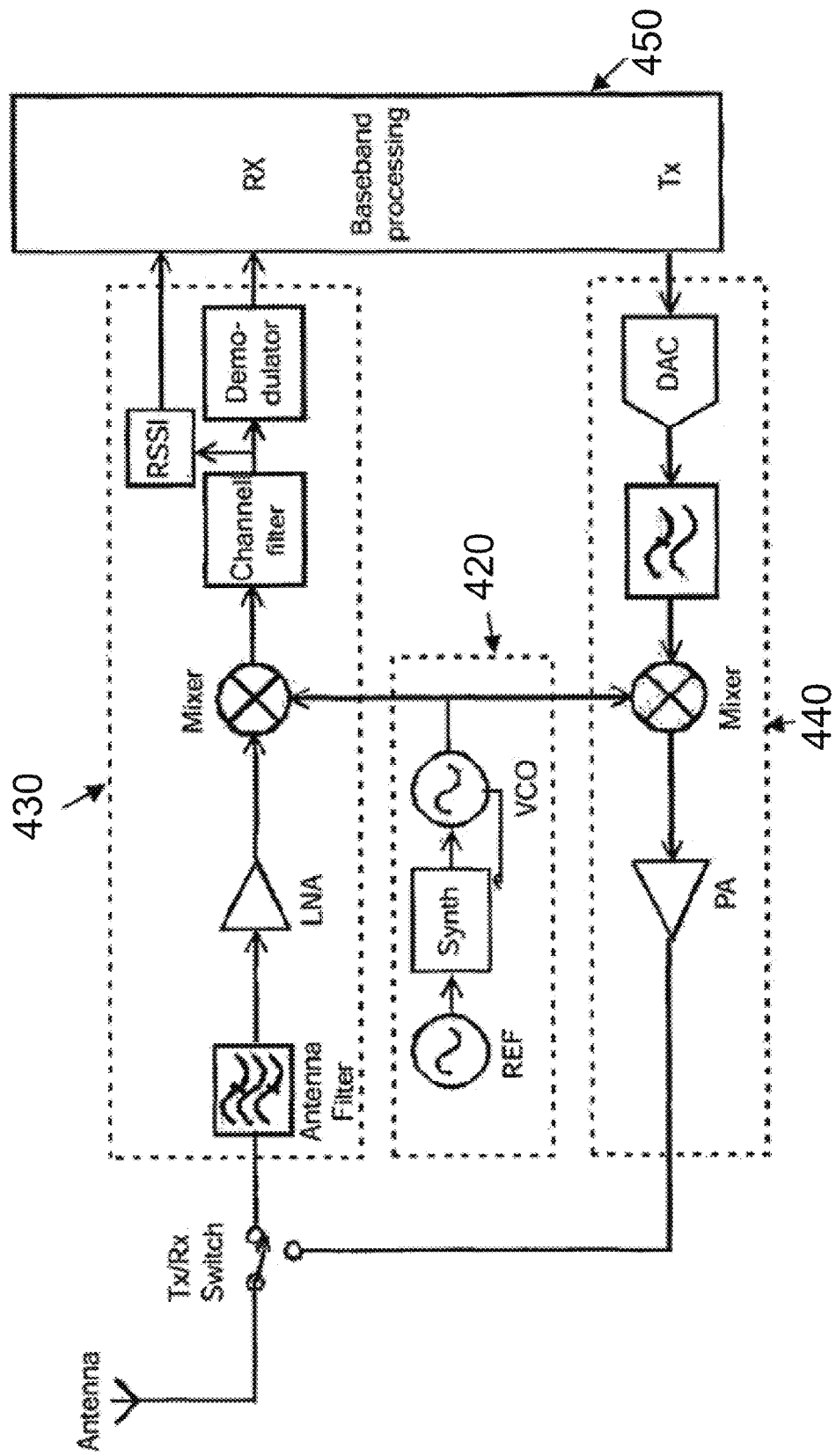
FIG. 4 is a block diagram of the circuitry of an exemplary RF chip, wherein the RF chip is a device under test (DUT).

FIG. 4 is a block diagram of the circuitry of an exemplary RF chip as a DUT. In one embodiment, the architecture of the RF chip can comprise a baseband section 450 connected with a transmission chain 440 comprising a digital to analog converter (DAC) for converting the intended digital signal to an analog signal, a mixing stage where the signal is mixed with the output of a frequency synthesizer block 420 and a power amplifier for amplifying the resulting signal. A receiving chain 430 comprises an antenna filter, a low noise amplifier, a mixing stage, channel filtering and demodulating stage. Such a general transceiver having transmission and reception means for generating and transmitting/receiving signals is well known to those skilled in the art. In an application, for example, a mobile phone or personal digital assistant (PDA), the transceiver is connected to an antenna for radiating or receiving radiated signals.

In a testing environment, prior to incorporation in a final product such as a mobile phone, for instance, the transmitter (Tx) 440 and receiver (Rx) 430 blocks are connected to relevant pins of the chip (if packaged) or a pad/probe applied to the appropriate test location on the silicon die containing the transceiver circuitry (if testing is prior to packaging). In a conventional tester, transmitter 440 would be connected to an RF port of the ATE tester hardware apparatus 202. However, in one embodiment, of the present invention, transmitter port 440 (the RF output signal) would be connected to one of the digital ports 312A-312N connected to the digital module 312 of the ATE tester hardware apparatus 202.

Figure 5:
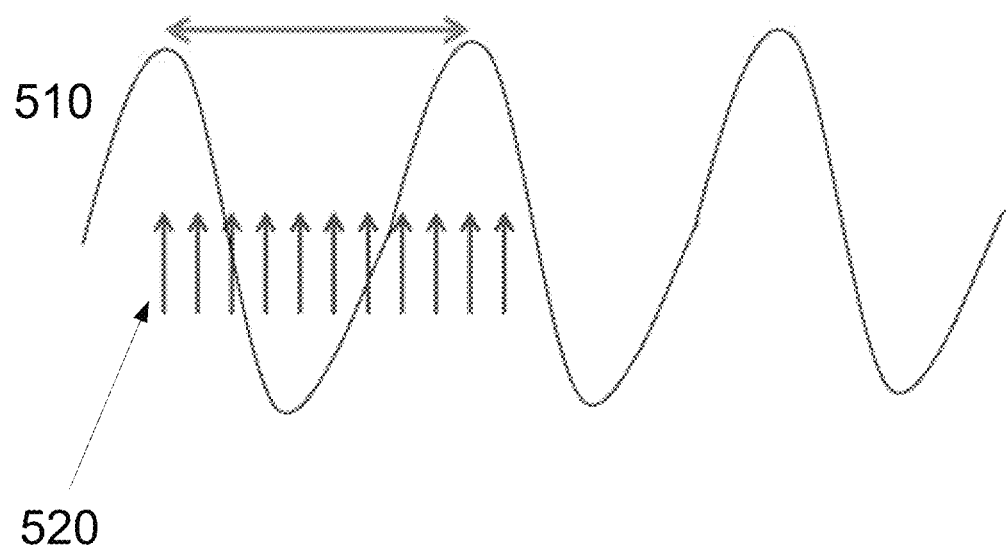
FIG. 5 is a diagram illustrating the capturing of an RF signal digitally in the time domain in accordance with one embodiment of the invention.

FIG. 5 is a diagram illustrating the capturing of an RF signal digitally in the time domain in accordance with one embodiment of the invention. The waveform 510 of the RF signal is captured in the time domain by one of the digital channels associated with ports 312A-312N. The waveform is sampled by the digital channel with a high sampling rate 520. In one embodiment, the sampling rate can be 1.6 Gigabits per second (Gbps), which corresponds to a minimum edge displacement of 0.625 ns. In other embodiments, sampling rates can be higher than 1.6 Gbps, which results in lower minimum edge displacement durations.

The digital channel, in one embodiment, can be configured to determine the frequency of the RF signal using the digital samples by performing a Fast Fourier Transform (FFT) procedure on the discrete signal. In short, the digital channel can determine the frequency of the RF signal by sampling the signal at a high sampling rate and performing a FFT operation on the captured samples which constitute the discrete signal. A spectrum analyzer linked to the tester apparatus can be used to visually observe the results of the FFT operation by the user and determine the frequency associated with the RF signal. The peak of the frequency spectrum generated by the FFT will correlate with the frequency of the RF signal. The peak of the frequency spectrum can be programmed to be identified by control module 302. Of course, because discrete-time signals are only approximations of the continuous-time signals, the determined frequency is going to be accurate only with a certain acceptable margin of error.

In order to characterize the RF signal, in addition to the frequency, the amplitude and/or power of the signal needs to be determined. The measurement of RF power is key to the testing of an RFIC power amplifier. Accordingly, the digital channel is also configured to perform power calculations on the incoming RF signal. In order to measure the power of the RF signal using the digital channel, the amplitude of the incoming signal needs to be determined. Once amplitude is determined, the tester system can calculate power using the well-known mathematical formula, Power=$V^2$/R, where R is the impedance of the channel and can be easily determined.

Figure 6:
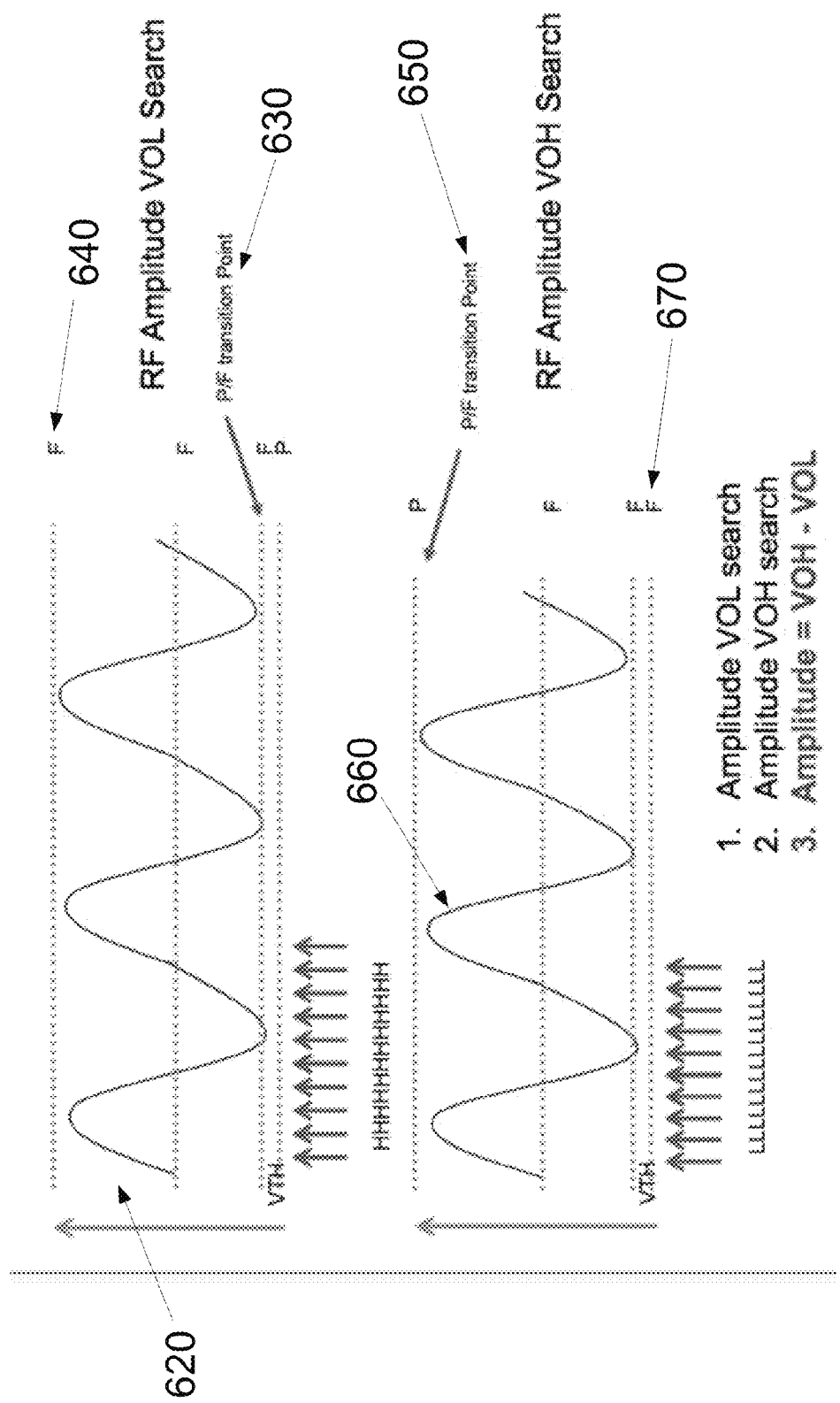
FIG. 6 is a diagram illustrating a method for determining the amplitude of an RF signal using the amplitude search method in accordance with one embodiment of the invention.

FIG. 6 is a diagram illustrating a method for determining the amplitude of an RF signal using the amplitude search method in accordance with one embodiment of the invention. In one embodiment, the amplitude search method of determining amplitude comprises scanning the discrete representation of the RF signal captured by the digital channel for a maximum output voltage (Voh) and a minimum output voltage (Vol) and calculating the difference between the two to determine the amplitude. The scanning can be performed using the discrete samples captured at the high data sampling rate of the digital channel.

In one embodiment, in order to determine Vol, the digital channel is configured to begin scanning the RF signal 620 at a voltage level 640, which is typically above the maximum point on the RF signal waveform in the time domain. The digital channel will continue scanning the curve at intervals, wherein each subsequent scan level is below a prior level. The scanning continues until the scan level crosses over a Pass/Fail (P/F) transition point 630. At transition point 630, all the scanned digital samples of the curve will be above a threshold voltage, which is the minimum output voltage (Vol). Similarly, in order to determine Voh, the digital channel can be configured to begin scanning the RF signal 660 at a voltage level 670, which is typically below the minimum point on the RF signal waveform. The scanning continues at intervals until the scan level once again crosses over a P/F transition point 650. At transition point 650, all the scanned digital samples of the curve will be under a threshold voltage, which is the maximum output voltage (Voh). Once Voh and Vol are determined, the difference between the two can be calculated in order to determine amplitude. As discussed above, the amplitude only needs to be accurate within a certain acceptable margin of error.

Figure 7:
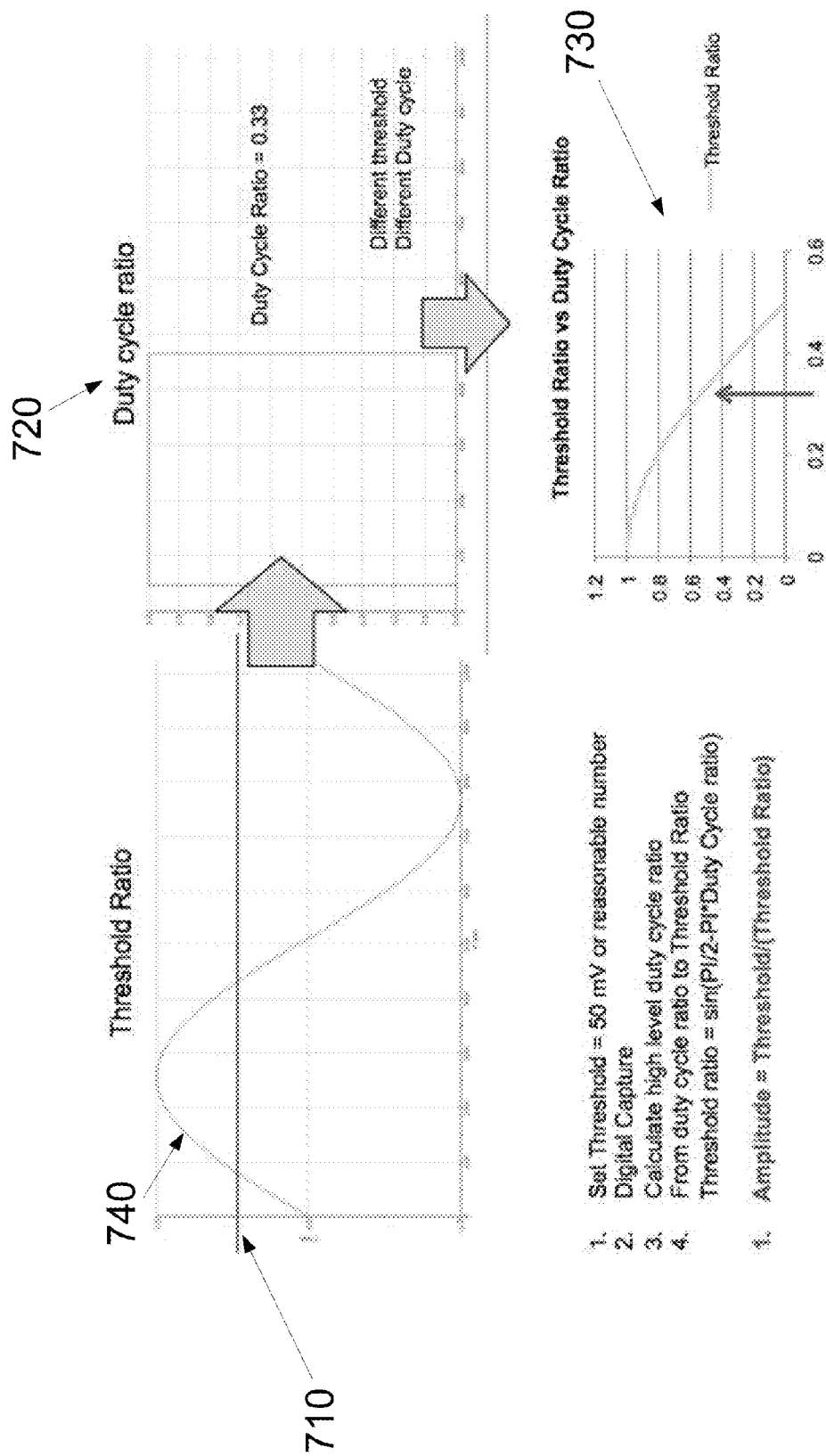
FIG. 7 is a diagram illustrating a method for determining the amplitude of an RF signal using the amplitude estimation method in accordance with one embodiment of the invention.

FIG. 7 is a diagram illustrating a method for determining the amplitude of an RF signal using the amplitude estimation method in accordance with one embodiment of the invention. In one embodiment, in order to determine the amplitude of the RF signal using the amplitude estimation method, the control module 302 first needs to set a reasonably chosen threshold voltage 710. The threshold voltage can be selected in a way such that it is within the range of the potential amplitude of the RF signal.

After the threshold voltage is selected, the RF signal 740 is sampled by the digital channel at a high sampling rate in the time domain. In one embodiment, the discrete signal used to determine the frequency can also be used to determine the amplitude using the amplitude estimation method. When enough samples have been captured, the duty cycle ratio 720 is determined for the threshold voltage selected. For example, for threshold voltage 710 as shown in FIG. 7, the duty cycle ratio will be approximately 0.33. The computed duty cycle ratio is then used to calculate a threshold ratio. In one embodiment, the duty cycle ratio is converted to the threshold ratio using the following formula:

Threshold Ratio=Sin((Pi/2)−(Pi*Duty Cycle Ratio))

In a different embodiment, the appropriate threshold voltage can also be determined using points plotted on a Threshold Ratio v. Duty Cycle Ratio curve 730. In other embodiments, other formulas or methods for determining a threshold ratio from a duty cycle ratio can also be used. Finally, the calculated threshold ratio along with the initial threshold voltage selected by the control module is used to determine the amplitude using the following formula:

Amplitude=Threshold/(Threshold Ratio).

As stated earlier, after determining amplitude, the tester system can calculate power using the well-known mathematical formula, Power=$V^2$/R, where R is the impedance of the channel and can be easily determined.

Measuring the frequency and power of the RF signal using the digital channel of an ATE apparatus allows the RF signal to be characterized cheaply and efficiently.

Figure 8:
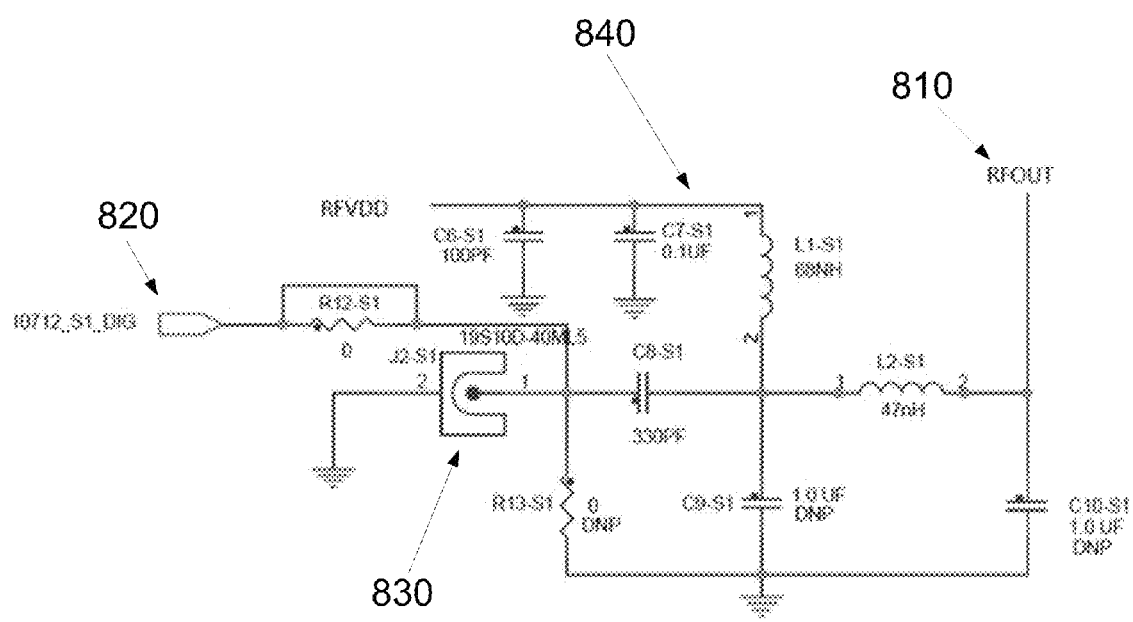
FIG. 8 is a diagram illustrating an exemplary test circuit for testing an embodiment of the invention.

FIG. 8 is a diagram illustrating an exemplary test circuit for testing an embodiment of the invention. The RF signal from the DUT to be tested can be routed to both a digital I/O on the tester system and an RF port I/O at the same time. A spectrum analyzer can be used to determine if the power and frequency measurements provided by using the digital channel correlate with the measurements from the traditional RF channel or are within an acceptable error range. The RF signal is received from the DUT being tested at input RFOUT 810. Mesh network 840 is used to smoothen the signal before it is inputted into the digital channel via digital port 820. At the same time, the signal can also be routed to a traditional RF port 830 via a SMP connector. The measurements from both the RF and digital channels can then be analyzed using a spectrum analyzer as discussed above.

Figure 9:
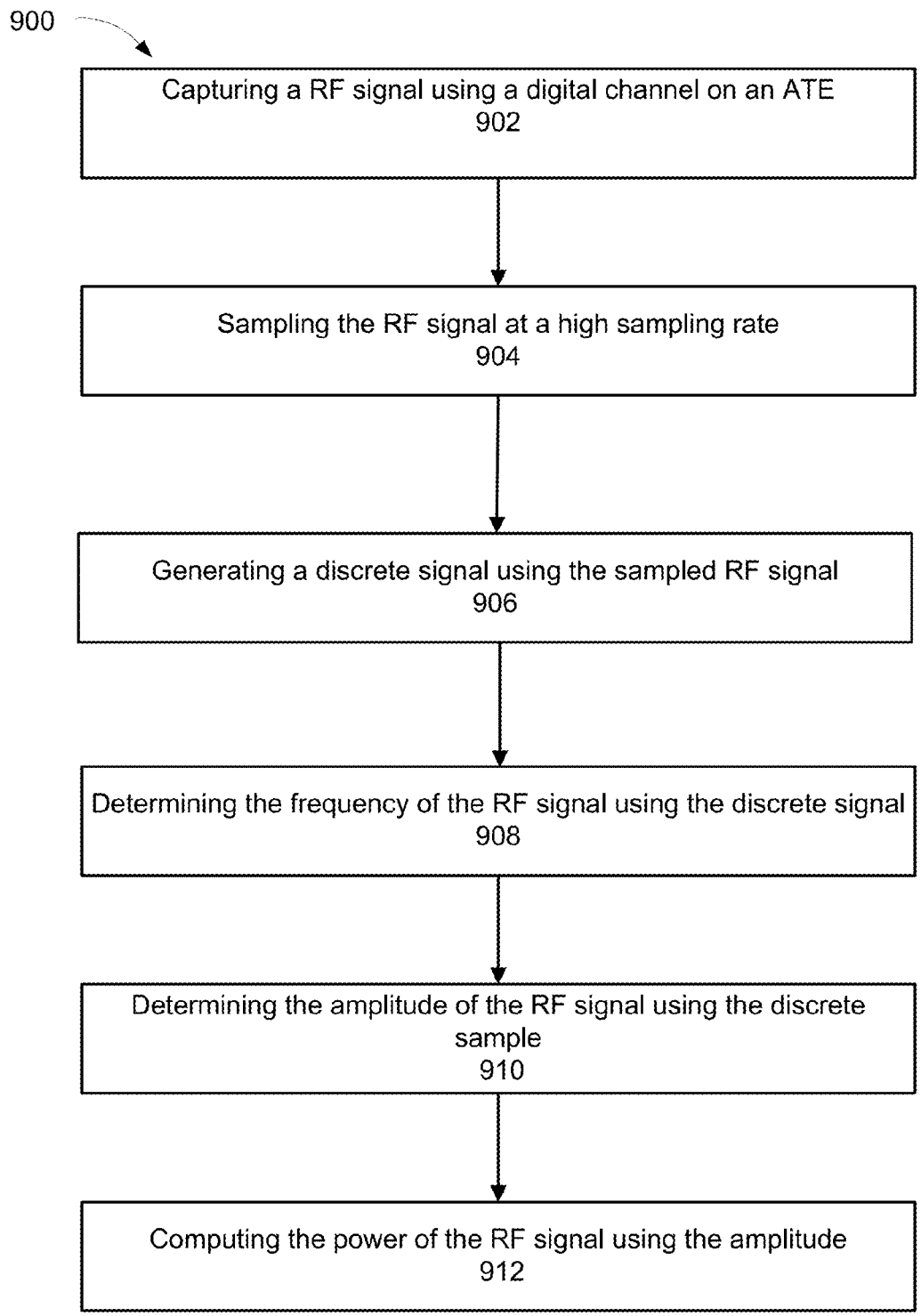
FIG. 9 depicts a flowchart of an exemplary process of measuring a power and frequency associated with a RF signal using a digital channel of an ATE in accordance with one embodiment of the present invention.

FIG. 9 depicts a flowchart of an exemplary process of measuring a power and frequency associated with a RF signal using a digital channel of an ATE in accordance with one embodiment of the present invention.

At step 902, a RF signal from a DUT is captured using a digital channel on an ATE apparatus. The RF signal is sampled at a high sampling rate at step 904. The signal is then digitized into a discrete-time signal at step 906. The discrete signal is then used to determine the frequency of the RF signal by performing an FFT operation on the discrete representation of the signal at step 908. The amplitude of the RF signal can be determined in one of various ways using the discrete signal at step 910. In one embodiment, the amplitude search method can be employed, while in another embodiment the amplitude estimation method can be employed. Finally, at step 912, the power of the RF signal is computed using the amplitude measurements.

Figure 10:
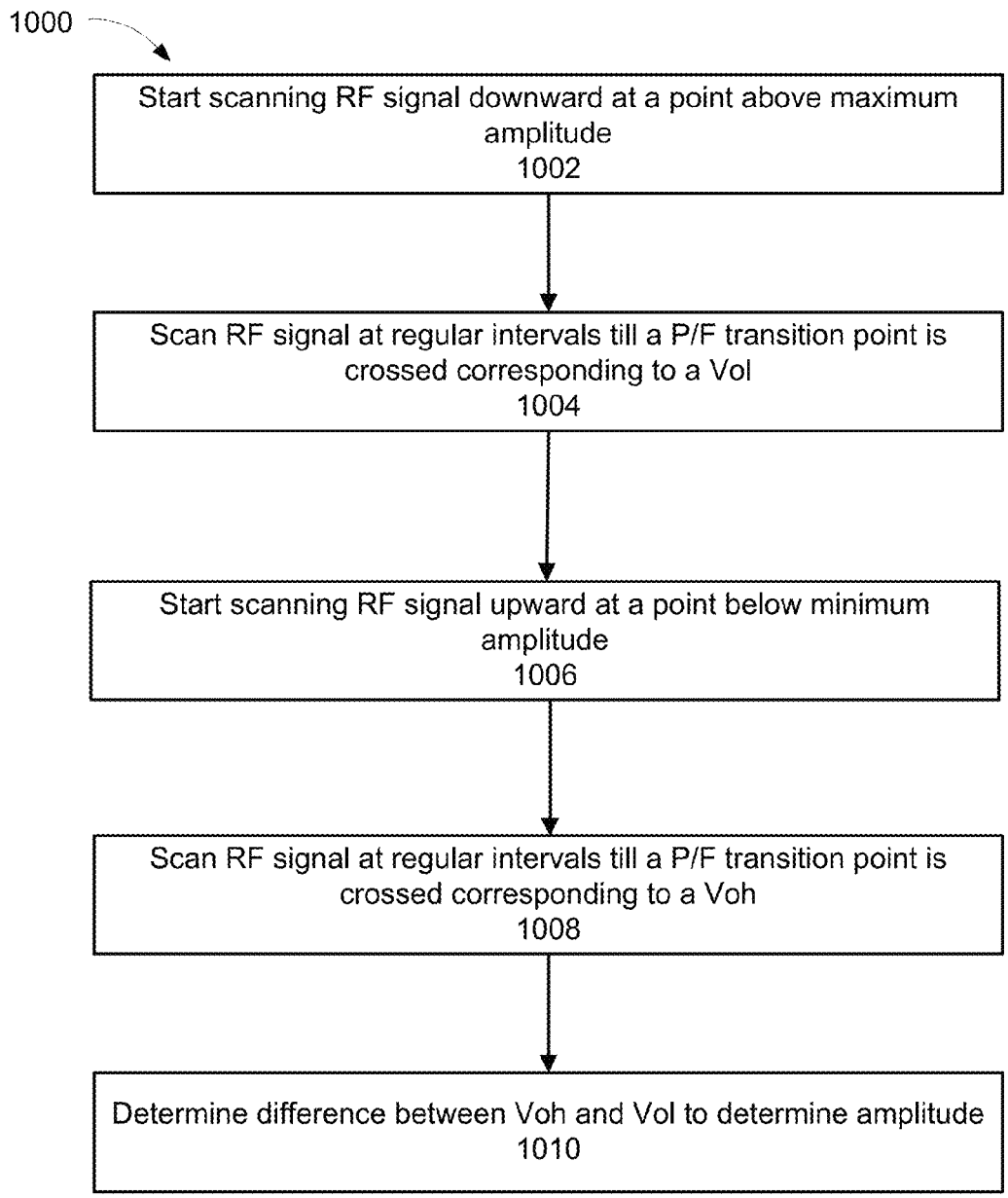
FIG. 10 depicts a flowchart of an exemplary process of determining the amplitude of an RF signal using the amplitude search method in accordance with one embodiment of the invention

FIG. 10 depicts a flowchart of an exemplary process of determining the amplitude of an RF signal using the amplitude search method in accordance with one embodiment of the invention. As discussed above, the amplitude search method of determining amplitude comprises scanning the discrete representation of the RF signal captured by the digital channel for a maximum output voltage (Voh) and a minimum output voltage (Vol) and calculating the difference between the two to determine the amplitude.

At step 1002, the digital channel is configured to begin scanning the RF signal 620 at a voltage level 640, which is typically above the maximum point on the RF signal waveform in the time domain. The digital channel will continue scanning the signal at intervals, wherein each subsequent scan level is below a prior level. At step 1004, the scanning continues till the scan level crosses over a Pass/Fail (P/F) transition point 630. At transition point 630, all the scanned digital samples of the curve will be above a threshold voltage, which is the minimum output voltage (Vol).

Similarly, in order to determine Voh, at step 1006 the digital channel can be configured to begin scanning the RF signal 660 at a voltage level 670, which is typically below the minimum point on the RF signal waveform. At step 1008, the scanning continues at intervals till the scan level once again crosses over a P/F transition point 650. At transition point 650, all the scanned digital samples of the curve will be under a threshold voltage, which is the maximum output voltage (Voh). Once Voh and Vol are determined, at step 1010, the difference between the two can be calculated in order to determine amplitude.

Figure 11:
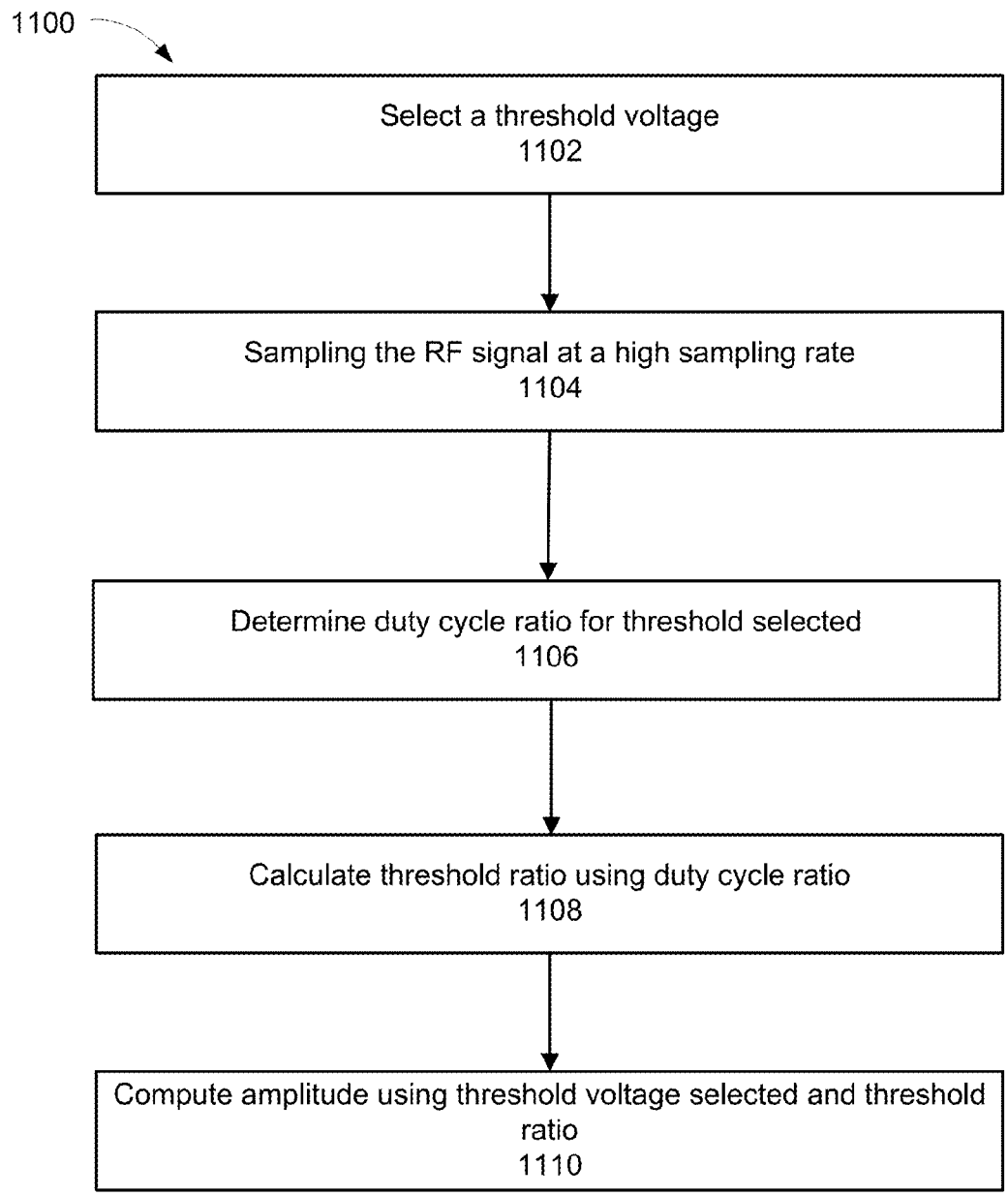
FIG. 11 depicts a flowchart of an exemplary process of determining the amplitude of an RF signal using the amplitude estimation method in accordance with one embodiment of the invention.

FIG. 11 depicts a flowchart of an exemplary process of determining the amplitude of an RF signal using the amplitude estimation method in accordance with one embodiment of the invention. In order to determine the amplitude of the RF signal using the amplitude estimation method, the control module 302 would at step 1102 need to set a reasonably chosen threshold voltage 710.

After the threshold voltage is selected, at step 1104, the RF signal 740 is sampled by the digital channel at a high sampling rate in the time domain. When enough samples have been captured, the duty cycle ratio 720 is determined for the threshold voltage selected at step 1106. At step 1108, the computed duty cycle ratio is then used to calculate a threshold ratio. Finally, at step 1110, the calculated threshold ratio along with the initial threshold voltage selected by the control module is used to determine the amplitude using the following formula:

$$\text{Amplitude} = \text{Threshold}/(\text{Threshold Ratio}).$$

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing using an automated test equipment (ATE), said method comprising:
    capturing a radio frequency (RF) signal using a digital port on said automated test equipment, wherein said RF signal is transmitted from a device under test (DUT) to be tested by said automated test equipment;
    sampling said RF signal at a sampling rate using a digital channel associated with said digital port;
    generating a discrete signal using results from said sampling; and
    determining a frequency and amplitude of said RF signal based on said discrete signal, wherein said determining said amplitude comprises estimating said amplitude by:
        selecting a threshold voltage, wherein said threshold voltage is selected to be within an approximate range of an amplitude of said RF signal; and
        computing a duty cycle ratio at said threshold voltage using said discrete signal.

2. The method of claim 1, further comprising
    calculating a power of said RF signal using said amplitude and an impedance of said digital channel.

3. The method of claim 1, wherein said determining said amplitude further comprises using an amplitude search process, said amplitude search process comprising:
    scanning said discrete signal downwards at regular intervals until a lower threshold point is crossed, wherein said lower threshold point is associated with a first point on said discrete signal;

scanning said discrete signal upwards at regular intervals until a higher threshold point is crossed, wherein said higher threshold point is associated with a second point on said discrete signal; and computing a difference between said first point and said second point to determine said amplitude.

4. The method of claim 1, wherein said estimating said amplitude further comprises:

calculating a threshold ratio using said duty cycle ratio; and calculating said amplitude using said threshold voltage and said threshold ratio.

5. The method of claim 4, wherein said threshold ratio is calculated from said duty cycle ratio using a predetermined formula.

6. The method of claim 1, wherein said determining a frequency comprises:

converting said discrete signal into a frequency domain representation; and identifying a peak on said frequency domain representation.

7. The method of claim 6, wherein said converting of said discrete signal into said frequency domain representation is performed using a Fast Fourier Transform (FFT) operation.

8. An automated test equipment (ATE) apparatus comprising:

a digital port operable to capture a radio frequency (RF) signal, wherein said RF signal is transmitted from a device under test (CUT);

a digital channel configured to sample said RF signal at a sampling rate, wherein said digital channel is associated with said digital port; and a control module configured to:

generate a discrete signal using results from a sampled RF signal; and determine a frequency and amplitude of said RF signal based on said discrete signal, wherein said determining said amplitude comprises selecting a threshold voltage, wherein said threshold voltage is chosen to be within an approximate range of an amplitude of said RF signal; and computing a duty cycle ratio at said threshold voltage using said discrete signal.

9. The apparatus of claim 8, wherein said control module is further configured to calculate a power of said RF signal using said amplitude and an impedance of said digital channel.

10. The apparatus of claim 8, wherein said control module is configured to determine said amplitude using an amplitude search method, and wherein said control module is further configured to:

scan said discrete signal downwards at regular intervals until a lower threshold point is crossed, wherein said lower threshold point is associated with a minimum point on said discrete signal;

scan said discrete signal upwards at regular intervals until a higher threshold point is crossed, wherein said higher threshold point is associated with a maximum point on said discrete signal; and compute a difference between said minimum point and said maximum point to determine said amplitude.

11. The apparatus of claim 8, wherein said control module is further configured to:

calculate a threshold ratio using said duty cycle ratio; and calculate said amplitude using said threshold voltage and said threshold ratio.

12. The apparatus of claim 11, wherein said threshold ratio is calculated from said duty cycle ratio using a predetermined formula.

13. The apparatus of claim 8, wherein said control module is configured to determine said frequency, and wherein said control module is further configured to:

convert said discrete signal into a frequency domain representation; and identify a peak on said frequency domain representation.

14. The apparatus of claim 8, wherein said control module is further configured to use a Fast Fourier Transform (FFT) in order to convert said discrete signal into said frequency domain representation.

15. A tester system comprising:

a plurality of digital ports, wherein each of said plurality of digital ports is operable to capture an RF signal, wherein said RF signal is transmitted from a DUT;

a plurality of digital channels, wherein each of said plurality of digital channels is associated with a respective digital port, and wherein each of said plurality of digital channels is configured to sample a respective RF signal; and a control module communicatively coupled to said plurality of digital channels, wherein said control module is configured to:

generate a respective discrete signal using samples from said respective RF signal for each of said plurality of digital channels; and determine a frequency and amplitude of said respective RF signal received through each of said plurality of digital channels using said respective discrete signal, wherein said control module is configured to determine said amplitude by: selecting a threshold voltage, wherein said threshold voltage is chosen to be within an approximate range of an amplitude of said RF signal; and computing a duty cycle ratio at said threshold voltage using a discrete signal, wherein said discrete signal is generated using samples from a respective RF signal received through each of said plurality of digital channels.

16. The system of claim 15, wherein said control module is further configured to calculate a power of said respective RF signal received through each of said plurality of digital channels using a respective amplitude and a respective impedance value for each of said plurality of digital channels.

17. The system of claim 15, wherein said control module is further configured to determine said amplitude using an amplitude search method, and wherein said control module is further configured to:

scan a discrete signal downwards at regular intervals until a lower threshold point is crossed, wherein said lower threshold point is associated with a minimum point on said respective discrete signal, wherein said discrete signal is generated using samples from a respective RF signal received through each of said plurality of digital channels;

scan said discrete signal upwards at regular intervals until a higher threshold point is crossed, wherein said higher threshold point is associated with a maximum point on said respective discrete signal; and compute a difference between said minimum point and said maximum point to determine said amplitude.

18. The system of claim 15, wherein said control module is further configured to determine said amplitude by performing:

calculating a threshold ratio using said duty cycle ratio; and calculating said amplitude using said threshold voltage and said threshold ratio.

19. The system of claim 18, wherein said threshold ratio is calculated from said duty cycle ratio using a predetermined formula.

20. The system of claim 15, wherein said control module is further configured to determine said frequency by performing:

converting a discrete signal into a frequency domain representation using a Fast Fourier Transform (FFT) operation, wherein said discrete signal is generated using samples from a respective RF signal received through each of said plurality of digital channels; and identifying a peak on said frequency domain representation.

\* \* \* \* \*